United States Patent [19]

Battin et al.

[11] Patent Number: 5,012,502
[45] Date of Patent: Apr. 30, 1991

[54] METHOD FOR DETERMINING DEGREE OF INTERCONNECTION OF SOLDER JOINTS USING X-RAY INSPECTION

[75] Inventors: John Battin, Poway; Thomas Stroebel, San Diego, both of Calif.

[73] Assignee: IRT Corporation, San Diego, Calif.

[21] Appl. No.: 539,132

[22] Filed: Jun. 18, 1990

[51] Int. Cl.$^5$ .................. G01B 15/06; B23K 31/12
[52] U.S. Cl. ........................... 378/58; 378/99; 228/103; 228/104
[58] Field of Search ............. 378/58, 99; 228/103, 228/104

[56] References Cited

U.S. PATENT DOCUMENTS

| | | | |
|---|---|---|---|
| 3,956,631 | 5/1976 | Crosby, Jr. | 250/321 |
| 4,403,410 | 9/1983 | Robinson | 29/830 |
| 4,409,333 | 10/1983 | Tosima et al. | 228/104 |
| 4,809,308 | 2/1989 | Adams et al. | 378/99 |
| 4,852,131 | 7/1989 | Armistead | 378/4 |
| 4,944,447 | 7/1990 | Thome | 228/103 |

Primary Examiner—Edward P. Westin
Assistant Examiner—Kim-Kwok Chu
Attorney, Agent, or Firm—Brown, Martin, Haller & McClain

[57] ABSTRACT

Determination of the quality of blind solder interconnections by X-ray inspection is made possible by forming indicator features on the pads of a component and the pads of the surface on which the component is to be mounted. The indicator features consist of an area which is different in size and/or shape than that of the other pad to be joined. For example, the indicator feature may be a circular region with an area approximately twice that of the pad to which it is to be joined. A relatively large amount of solder is deposited on the smaller pad and the two pads are placed in contact. During reflow, the molten solder on the smaller pad will flow to cover the full area of the indicator feature, indicating that a good interconnection was obtained. The indicator features may also be a different shape from that of the pad to which it is to be joined so that the solder deposited on the pad will take on the shape of the indicator feature when successful interconnection is achieved.

27 Claims, 1 Drawing Sheet

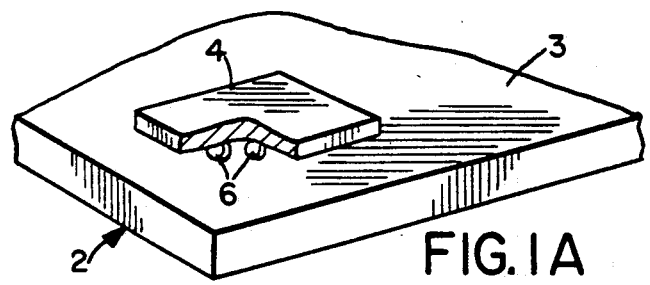
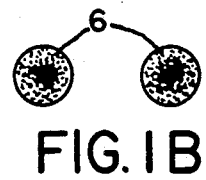
FIG. 1A  FIG. 1B
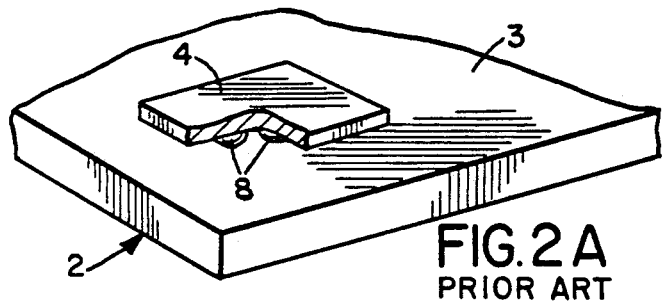
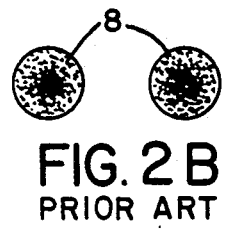
FIG. 2A PRIOR ART  FIG. 2B PRIOR ART
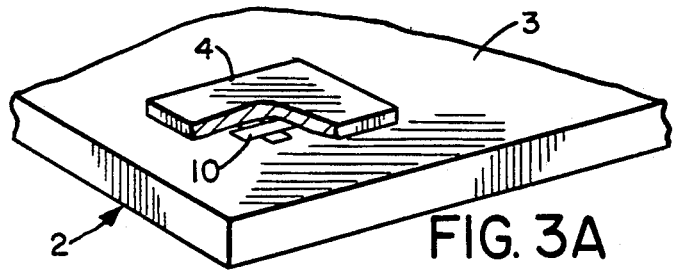
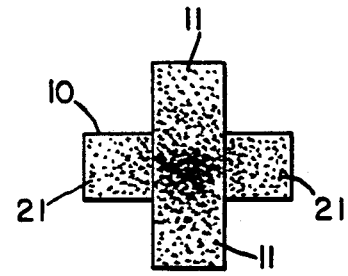
FIG. 3A  FIG. 3B
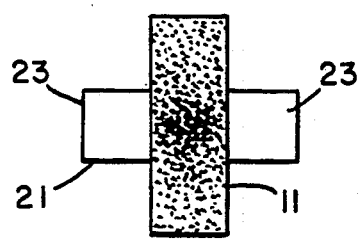
FIG. 3C
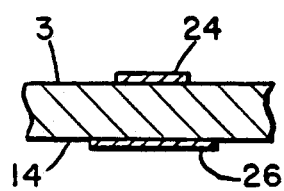
FIG. 4
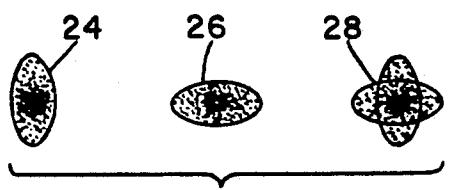
FIG. 5A
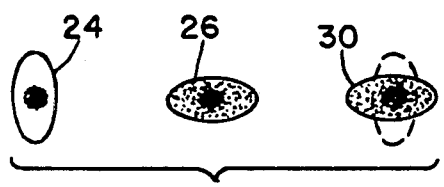
FIG. 5B
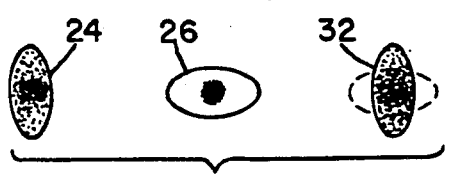
FIG. 5C

METHOD FOR DETERMINING DEGREE OF INTERCONNECTION OF SOLDER JOINTS USING X-RAY INSPECTION

BACKGROUND OF THE INVENTION

1. Field of the Invention

The present invention relates to X-ray inspection techniques for electrical circuit boards and similar structures. More specifically, the present invention relates to a method for determining the degree of interconnection of solder joints for printed circuit boards, hybrid boards, padgrid arrays and semiconductor packaging.

2. Description of Related Art

In electronics, components are typically mounted upon or inserted into a circuit board. The electrical contact between a circuit board and the components is assured by soldering of the component into permanent position. Thereafter, the electrical integrity of the circuit board depends upon the mechanical integrity of the soldering performed during the circuit board assembly. Soldering processes are well-known and may be reasonably controlled to correct solder-related deficiencies. However, soldering processes do not always work perfectly with deficiencies such as solder skips, bridges, lack of wetting, insufficient amounts of solder, blowholes and pinholes which can occur as a result of variations in materials in the solder process. Defects, such as those just mentioned, occur sufficiently often such that it is mandatory to inspect solder connections to reduce solder connection related failures.

Early inspections were strictly visual, with the external appearance of the solder connection being used to infer internal structural integrity. However, visual inspection could not verify the uniformity of the solder within the connection, and could not detect defects that are hidden below components mounted onto a flat surface. Solder uniformity has a critical influence on the strength and durability of the solder connection. Solder connection strength and uniformity are particularly important in the connection of surface mount devices where the devices are held entirely by the solder connection. It is well-known in the surface mount device art that solder connections are more susceptible to thermal and mechanical stress related failures than pin mounted devices. In surface mounted devices, visually inspected structurally marginal connections, due to solder non-uniformity, may still provide electrical connection without the defect being discovered in stress testing. As a result, the marginal connection or hidden defect is a likely candidate for a longterm failure while in use under normal mechanical and thermal stress. With an increasing number of surface mount components being used, visual inspections have proven to be too unreliable in detecting structural deficiencies in the solder connections.

Visual inspection systems for solder quality are available to detect defects such as missing components, cracked or incomplete solder joints, misaligned components, and missing or excess solder. In many applications, however, defects are hidden from visual inspections systems. An example of such a defect is in the case of solder porosity and voids in solder connections beneath surface mount devices. While defects may not be masked by visual barriers, increasing circuit density may result in defects which are not readily apparent to the human eye at production line inspection rates. Even with machine visual inspection systems, inspection deficiency still exists. For example, machine visual inspection system would be unavailable for inspecting defects such as unwanted solder balls under a pad-grid array.

The use of X-ray inspection techniques enables the inspection of visually hidden defects. The metallic alloys used in solder are partially opaque to X-rays as compared to the translucence to X-rays of the ceramics, epoxies, silicon or copper materials used in circuit board assemblies. In addition, the ceramics, epoxies, silicon or copper materials have different degrees of translucence so as to permit the distinction between these materials. As a result, small defects in the solder interconnection are readily identified.

X-ray inspection images are effectively three dimensional, i.e. length, width and thickness, with length and width (or size) being represented by object contrast from surrounding areas with thickness being represented by the shades of grey or black. With data corresponding to the size and thickness of the solder connection, a determination can be made as to the quality of the solder connection. An automated system capable of such X-ray inspection is disclosed in U.S. Pat. No. 4,809,308, where solder quality is digitally quantified to provide the ability to set accept/reject criteria.

The X-ray image of a solder joint will most likely appear as a circle which is darker at its center and fades to lighter shades of gray towards the perimeter, the darker center indicating the point of greatest thickness. An applied solder ball which has not been sufficiently reflowed to provide good interconnection will also appear as an X-ray image of a circle which is dark at its center, fading towards lighter shades of gray at the perimeter, with the only possible distinguishing feature being a slight change in the area of the circle. Inadequacies exist, therefore, even in present-art X-ray inspection techniques for determining all types of potential defects. In addition, double-sided circuit boards present a special difficulty for X-ray inspection techniques when a solder joint on one side of the board is directly opposite a solder joint on the other side of the board. The X-ray image in this situation will be of two solder joints superimposed on one another, making it difficult to determine the location of any defects in one or both of the joints.

The technique of X-ray inspection is also applicable to hybrid assemblies and semiconductor packaging, especially flip-chips. In flip-chip packaging rather than using bond wires, solder is applied directly to the pads of the chip which is flipped over to be attached directly to the package leads, making visual inspection impossible.

It would be desirable to have a reliable method of determining whether interconnection has been achieved which is compatible with X-ray inspection techniques and which does not require a substantial change in the board manufacturing process.

SUMMARY OF THE INVENTION

It is an advantage of the present invention to use X-ray inspection to provide a new and improved method of determination for the degree of interconnection of blind solder joints.

The invention is based on the fact, well known to those versed in the soldering art, that, provided the surface of a connection pad is properly prepared, molten solder will adhere to the pad and will flow until it covers the entire area of the pad. In the soldering art this process is known as "wetting" of the pad by the solder. The proper pad preparation to achieve solder wetting of the pad includes cleaning, "tinning", and other steps well known to persons versed in the soldering art.

When the surfaces of two connection pads are joined together by a certain amount of solder, a solder joint is formed. It is well known that this joint has its maximum strength when the solder has flowed to cover the entire area of the two connection pads. It is the object of this invention to provide a method of determination that the solder has flowed thusly over the two connection pads.

In an exemplary embodiment, indicator features are formed on the two pads to be joined. The indicator features consist of pad shapes, sizes and orientations that allow X-ray images of the solder joint to display the edges of both pads. For example, both pads may have a rectangular shape, with a first pad oriented at an angle of approximately 90° to a second pad. Likewise, a first pad may be circular and a second pad may be in the shape of a cross or star with points extending beyond the perimeter of the circular pad. Other possible geometries will be apparent to the knowledgeable reader. Each geometry has the property that the edges of each pad are not hidden by the other pad. A relatively large amount of solder is placed on the first pad, and the second pad is placed in contact with the solder on the first pad. During a proper reflow, the solder will flow over both pads and will fully cover both pads. It is an advantage of this invention that the full flow of the solder over both pads may be confirmed by an X-ray image that displays that solder has flowed to the edges of both pads.

In a second embodiment, one of the pads may be easily visible for inspection before the pads are joined. Under that condition a relatively large amount of solder is deposited on the first pad, and the complete wetting of this first pad may be confirmed by visual or X-ray inspection before it is joined to the second pad. When this situation exists, the indicator feature is required only to assure that the solder has properly flowed over the entire area of second pad. In this embodiment the indicator feature may be a pad diameter for the second pad that is a certain amount larger than the diameter of the first pad. For example, the diameter of the second pad may be approximately twice that of the second pad. During a proper solder reflow, the molten solder on the first pad will flow to cover the entire area of the second pad. This may be confirmed by X-ray inspection even though the solder joint is fully hidden from the view of the observer's eye.

For each embodiment, if complete interconnection is not achieved, the solder will not cover the full areas of the indicator features. This will be detected by the X-ray inspection system and the solder joint will be classified as a "reject".

When the features of the second embodiment can be combined with the features of the first embodiment, double-sided circuit boards which have blind solder interconnections opposite each other can be X-ray inspected for degree of interconnection of joints on both sides of the circuit board. In an exemplary embodiment for double-sided circuit boards, one of the pads on a first side of the board has a different size, shape or orientation than one of the pads on a second side of the board. These two sizes, shapes and orientations are selected so that the edges of each pad are not hidden by the other pad. The second pad on the first side and the second pad on the second side are inspected to assure full solder flow over these second pads, thereby confirming that good interconnection has been achieved on both sides of the board.

BRIEF DESCRIPTION OF THE DRAWINGS

FIG. 1 is a perspective view of a circuit board and an electronic component before reflow of the solder and the corresponding X-ray image.

FIG. 2 is a perspective view showing prior art reflowed solder joints and the corresponding X-ray image.

FIG. 3 is a perspective view and corresponding X-ray image incorporating the method of the present invention.

FIG. 4 is a side view showing application to double-sided boards.

FIG. 5 is a top view of X-ray images formed of a double-sided board according to the method of the present invention.

DESCRIPTION OF THE PREFERRED EMBODIMENT

The present invention is a method of enabling X-ray inspection systems to more readily detect solder defects related to insufficient interconnection. Referring to FIGS. 1, 2 and 3, FIG. 1a, 2a and 3a illustrate perspective views of the circuit board 2 with an electronic component 4 attached to the board with solder.

In FIG. 1a, unreflowed solder balls 6 are under the component 4. The solder balls 6 are nearly spherical and, thus, have the greatest amount of material across the center running from top to bottom. For X-ray imaging, this means that the center of the circle which is created by projecting X-rays through the solder balls 6 will be dark or black, with the image becoming lighter progressing outward from the center, as shown in FIG. 1b.

FIG. 2a illustrates a reflowed solder joint of the prior art. Upon exposure to heat the solder which was deposited on the board retains that size and shape of the pad onto which it was deposited if both pads are the same, making it impossible to determine if the solder actually flowed to the pad of the component and made contact. Although thickness in the center may be reduced compared to the original solder ball, the reflowed solder 8 is only slightly larger than it was originally, causing an X-ray image, shown in FIG. 2b, which is similar to that for an unreflowed solder ball 6, differing only by slightly increased diameter. Such subtle changes are difficult to detect and, thus, defects relating to incomplete interconnection may often go undetected.

FIG. 3a illustrates a reflowed solder joint 10 which utilizes the method of the present invention. Indicator features are patterned in the metal on the pads to be joined at the locations where an interconnection is to be made with solder. In FIG. 3b, a pair of rectangular indicator features, consisting of crossed rectangles 11 and 21 is shown, but any shape which permits distinguishing the edges of the two pads falls within the scope of the invention. Examples of such shapes include circles, ovals, squares, triangles, diamonds, stars, crescents, etc. The key condition is that the first indicator feature must be an area, shape or orientation which is different from the second indicator feature to which it is to be joined so that the molten solder would not expand to fill both areas or shapes, but for the wicking of the liquid solder caused by the indicator features.

In one embodiment, the indicator features are patterned on the component using the same masking and etching step as would normally define the pads and on the board to which the component is to be attached. The important point is that the pads comprising the two indicator features are deliberately made of different shape, size and/or orientation.

Solder is deposited on the circuit board to which the component is to be attached. A small amount of solder may be placed on the surface opposite that on which the bulk of the solder is deposited to inhibit oxidation of the metal surface. The two indicator features are placed in contact with the solder ball located between the two surfaces, then the board is exposed to heat to liquify and reflow the solder. When the solder becomes sufficiently molten, the wetting of the pads by the solder will cause it to be drawn to the indicator features' dimensions, expanding to cover the additional area and/or different shape of each indicator feature. Full coverage of both indicator features by the solder is an accurate indication that good interconnection between the pad on the component and the pad on the board has been successfully achieved.

An X-ray image of the successful interconnection between the two indicator features 11 and 21, shown in FIG. 3b, will be digitized and the coverage to the edges of both indicator features used to trigger an "accept" signal based upon accept/reject criteria for the amount of pad area covered by the solder. The light area 23 shown in FIG. 3c would be seen in the X-ray image if the solder had not flowed sufficiently into indicator feature 21 to produce good interconnection. The X-ray inspection system would be programmed to classify the light image 23 of the indicator feature as a "reject".

It should be noted that while this technique is illustrated for use with an automated X-ray inspection system, it is equally applicable to less sophisticated X-ray inspection procedures such as manual or visual X-ray inspection.

The use of indicator features is also applicable to X-ray inspection of interconnections for hybrid board assemblies, pad-grid arrays, and between semiconductor chips and packages. The latter technique may be accomplished by directly connecting the chip's pads to the package leads, i.e., a "flip-chip". The pads of a semiconductor chip are readily controlled for size and shape by standard photolithographic techniques to permit formation of indicator features, and the indicator features may also be patterned on the package pads. Solder is deposited on the package pads so that good interconnection is detected by the solder conforming to the indicator features which will have been patterned on both the chip and the package.

Using the prior art, double-sided circuit boards are difficult to inspect for the degree of interconnection when, from an X-ray point of view, one solder joint is superimposed over another. For double-sided board with solder joints directly opposite each other, one possible embodiment is shown in FIG. 4, with indicator feature 24 and indicator feature 26 being ovals with different orientations on the first side 3 and second side 14, respectively.

FIG. 5 shows various possible combinations of X-ray images when the method of the present invention is used for inspection of double-sided circuit boards. To obtain the most thorough inspection, a first connection pad on each side of the board would be determined to be fully covered by solder in a prior inspection of the pad before the two pads are placed in contact. By forming second indicator features of different orientations or different shapes on both sides of the circuit board, it is possible to determine whether adequate interconnection has been achieved. Insufficient interconnection of one or both solder joints can be detected, with a clear indication of which joint is defective.

FIG. 5a illustrates X-ray images of successful interconnection on the first side, e.g., the indicator feature 24 and on the second side, e.g., indicator feature 26. The two joints are readily, individually distinguishable in third image 28 which consists of the indicator feature 24 from the first side 3 superimposed on the indicator feature 26 from the second side 14.

FIGS. 5b and 5c illustrate incomplete flow onto the indicator feature 24 of first side 3 and onto the indicator feature 26 of the second side 14, respectively. In both cases it can be easily determined where the defect lies, even when the solder joints are superimposed in the X-ray image. In the case of incomplete coverage of indicator feature 24, superimposed image 30 shows only the indicator feature 26, with a darkened center due to the incompletely flowed solder in indicator feature 24. Where insufficient interconnection has occurred on the second side 14, superimposed image 32 shows only indicator feature 24 from the first side 3. The bulges of the oval of indicator feature 26, shown by dotted lines, have not been filled by solder and therefore indicate that the interconnection was not completely made on the second side.

It will be evident that there are additional embodiments which are not illustrated above but which are clearly within the scope and spirit of the present invention. The above description and drawings are therefore intended to be exemplary only and a scope of the invention is to be limited solely by the appended claims.

We claim:

1. A method of determining the quality of solder interconnection of a solder joint between a first electrical member and a second electrical member by X-ray inspection comprising:

forming a first indicator feature at a first solder joint location of said first electrical member, said first indicator feature having a first set of parameters comprising size, shape and orientation;

forming a second indicator feature at a second solder joint location of said second electrical member, said second indicator feature having a second set of parameters comprising size, shape and orientation of which at least one of said second set of parameters is different from that of said first set of parameters, so that at least one edge of both said first and said second indicator features are visible in an X-ray image of said solder joint, and so that melting of solder deposited on said first indicator feature when said solder is in contact with said second indicator feature will cause said solder to flow and solidify upon cooling to cover all of said first indicator feature and all of said second indicator feature; and taking an X-ray image of said solder joint;

inspecting said X-ray image to determine whether said solder has fully covered said first indicator feature and said second indicator feature, whereby quality of said solder joint interconnection is determined to be good if said solder flowed to fully cover both indicator features, and quality of said solder joint interconnection being determined to be poor if said solder did not flow to fully cover both indicator features.

2. A method as in claim 1 wherein said X-ray image is digitized by a digital computer, and inspection is performed thereby.

3. A method as in claim 1 wherein said first electrical member is a printed circuit board and said second electrical member is an electronic component.

4. A method as in claim 1 wherein said first electrical member is an electronic component and said second electrical member is a printed circuit board.

5. A method as in claim 1 wherein said first electrical member is a hybrid board assembly and said second electrical member is an electrical component.

6. A method as in claim 1 wherein said first electrical member is an electronic component and said second electrical member is a hybrid board assembly.

7. A method as in claim 1 wherein said first electrical member is a package for semiconductors and said second electrical member is a semiconductor chip.

8. A method as in claim 1 wherein said first electrical member is a semiconductor chip and said second electrical member is a package for semiconductors.

9. A method of determining the quality of solder interconnection of a solder joint between a first electrical member and a second electrical member by X-ray inspection, comprising:
    forming an indicator feature at a solder joint location of said second electrical member, said indicator feature having a first set of parameters comprising area, shape and orientation which are different from a second set of parameters of a connection pad on said first electrical member, so that edges of said indicator feature are visible in an X-ray image of said solder joint, and so that melting of solder deposited on said connection pad, when said solder is in contact with both said indicator feature and said connection pad, will cause said solder to flow and solidify upon cooling to cover said indicator feature;
    taking an X-ray image of said solder joint showing said indicator feature; and
    inspecting said X-ray image to determine whether said solder has flowed fully to cover said indicator feature, quality of said solder interconnection being determined to be good if said solder fully covered said indicator feature, and quality of said solder interconnection being determined to be poor if said solder did not fully cover said indicator feature.

10. A method as in claim 9 wherein said X-ray image is digitized by a digital computer and inspection is performed thereby.

11. A method as in claim 9 wherein said first electrical member is a printed circuit board and said second electrical member is an electronic component.

12. A method as in claim 9 wherein said first electrical member is an electronic component and said second electrical member is a printed circuit board.

13. A method as in claim 9 wherein said first electrical member is a hybrid board assembly and said second electrical member is an electrical component.

14. A method as in claim 9 wherein said first electrical member is an electronic component and said second electrical member is a hybrid board assembly.

15. A method as in claim 9 wherein said first electrical member is a package for semiconductors and said second electrical member is a semiconductor chip.

16. A method as in claim 9 wherein said first electrical member is a semiconductor chip and said second electrical member is a package for semiconductors.

17. A method of determining the quality of solder interconnection between a double-sided first electrical member and at least two different electrical members by X-ray inspection comprising:
    forming a first indicator feature at a first solder joint location on a first side of said first electrical member, said first indicator feature having a first set of parameters comprising shape, orientation and area, at least one of said first set of parameters being different than a second set of parameters of a corresponding pad of a second electrical member so that heat treatment of solder deposited on said corresponding pad of said second electrical member when said solder is in contact with said first indicator feature causes said solder to flow and solidify upon cooling to cover said first indicator feature;
    forming a second indicator feature at a second solder joint location on a second side of said first electrical member opposite said first side, said second indicator feature having a third set of parameters comprising shape, orientation and area, at least one of said set third set of parameters being different from one of said first set of parameters, said area of said third set of parameters being different than an area of a corresponding pad of a third electrical member, so that heat treatment of solder deposited on said corresponding pad of said third electrical member causes solder to flow and solidify upon cooling to cover said second indicator feature, said second indicator feature being disposed opposite said first indicator feature so as to be overlying said first indicator feature with at least one edge of each indicator feature visible when viewed by X-ray inspection;
    taking an X-ray image of both said solder joints showing both said first and second indicator features; and
    inspecting said X-ray image to determine whether said solder has flowed fully to cover said first indicator feature and said second indicator feature, quality of solder interconnection on said first side being determined to be good if said solder flowed to fully cover said first indicator feature, and quality of said solder joint interconnection on said first side being determined to be poor if said solder did not fully cover said first indicator feature, and quality of solder interconnection on said second side being determined to be good if said solder flowed to the edges of said second indicator feature, and quality of said solder joint interconnection on said second side being determined to be poor if said solder did not fully cover said second indicator feature.

18. A method as in claim 17 wherein said X-ray image is digitized by a digital computer and inspection is performed thereby.

19. A method as in claim 17 wherein said first electrical member is a printed circuit board and said second electrical member is an electronic component.

20. A method as in claim 17 wherein said first electrical member is an electronic component and said second electrical member is a printed circuit board.

21. A method as in claim 17 wherein said first electrical member is a hybrid board assembly and said second electrical member is an electrical component.

22. A method as in claim 17 wherein said first electrical member is an electronic component and said second electrical member is a hybrid board assembly.

23. A method as in claim 17 wherein said first electrical member is a package for semiconductors and said second electrical member is a semiconductor chip.

24. A method as in claim 17 wherein said first electrical member is a semiconductor chip and said second electrical member is a package for semiconductors.

25. A method of determining the quality of solder interconnection between said first electrical member and a second electrical member by X-ray inspection comprising:

forming an indicator feature at a solder joint location of said first electrical member, said indicator feature having a first shape and first area which is different from a second area of a corresponding pad of said second electrical member, said corresponding pad having a second shape, so that melting of solder deposited on said corresponding pad when said solder is in contact with said indicator feature causes said solder to flow and solidify upon cooling to cover said first area;

taking an X-ray image of said solder joint showing said indicator feature; and inspecting said X-ray image to determine whether said solder has flowed fully to cover said indicator feature, quality of said solder interconnection being determined to be good if said solder fully covered said indicator feature, and quality of said solder interconnection being determined to be poor if said solder did not fully cover said indicator feature.

26. A method as in claim 25 wherein said first shape is the same as said second shape.

27. A method as in claim 25 wherein said first area is at least twice as large as said second area.

* * * * *